(12) United States Patent
Fukuoka et al.

(10) Patent No.: US 7,306,346 B2
(45) Date of Patent: Dec. 11, 2007

(54) ORGANIC ELECTROLUMINESCENCE DISPLAY APPARATUS AND METHOD FOR MANUFACTURING THE SAME

(75) Inventors: Nobuhiko Fukuoka, Ebina (JP); Nobuyuki Ushifusa, Yokohama (JP); Issei Takemoto, Hiratsuka (JP); Yoshinori Ishii, Chiba (JP)

(73) Assignee: Hitachi Displays, Ltd., Mobara-shi (JP)

( * ) Notice: Subject to any disclaimer, the term of this patent is extended or adjusted under 35 U.S.C. 154(b) by 26 days.

(21) Appl. No.: 11/138,469

(22) Filed: May 27, 2005

(65) Prior Publication Data

US 2005/0269926 A1  Dec. 8, 2005

(30) Foreign Application Priority Data

May 27, 2004  (JP) .............................. 2004-157949

(51) Int. Cl.
*F21V 9/16* (2006.01)
(52) U.S. Cl. .......................... 362/84; 362/267; 313/512
(58) Field of Classification Search ...................... None
See application file for complete search history.

(56) References Cited

U.S. PATENT DOCUMENTS

| | | | | |
|---|---|---|---|---|
| 6,081,071 | A * | 6/2000 | Rogers ........................ | 313/512 |
| 6,180,549 | B1 * | 1/2001 | Mazany et al. ................ | 502/64 |
| 6,649,213 | B2 * | 11/2003 | Debikey et al. ............. | 427/161 |
| 6,688,228 | B2 * | 2/2004 | Hiraoka ....................... | 101/462 |
| 6,808,828 | B2 * | 10/2004 | Ohata .......................... | 428/690 |
| 6,833,668 | B1 * | 12/2004 | Yamada et al. .............. | 313/505 |
| 6,835,953 | B2 * | 12/2004 | Cok et al. ...................... | 257/59 |
| 6,847,355 | B1 * | 1/2005 | Nishikawa et al. .......... | 345/173 |
| 6,861,801 | B2 * | 3/2005 | Kim et al. .................... | 313/512 |
| 6,861,802 | B2 * | 3/2005 | Hishida ....................... | 313/512 |
| 6,888,307 | B2 * | 5/2005 | Silvernail et al. ............ | 313/512 |
| 6,899,749 | B2 * | 5/2005 | Johansson ..................... | 96/119 |
| 6,992,439 | B2 * | 1/2006 | Yamazaki et al. ........... | 313/512 |
| 7,044,661 | B2 * | 5/2006 | Kandar-Kallen et al. ..... | 385/94 |
| 2003/0209980 | A1 * | 11/2003 | Sasatani et al. .............. | 313/553 |

FOREIGN PATENT DOCUMENTS

| | | |
|---|---|---|
| JP | 09-148066 | 6/1997 |
| JP | 10-275679 | 10/1998 |
| JP | 2000-173766 | 6/2000 |
| JP | 2002-280169 | 9/2002 |
| JP | 2003-142257 | 5/2003 |

\* cited by examiner

*Primary Examiner*—Sandra O'Shea
*Assistant Examiner*—Kristen A Manskar
(74) *Attorney, Agent, or Firm*—Mattingly, Stanger, Malur & Brundidge, P.C.

(57) ABSTRACT

Inside surround desiccant pattern A surrounding an organic EL element by bonding an element substrate to a sealing board, outside surround desiccant pattern C surrounding the inside surround desiccant pattern A, and internal desiccant pattern (having a thinner film thickness than the inside surround desiccant pattern A) surrounded by the inside surround desiccant pattern A are formed on the sealing board by one time screen printing. For this purpose, a screen mask is utilized on which opening patterns for the inside and outside surround desiccant patterns A, C and an opening pattern having a narrower opening width than the opening patterns for A and C for forming an internal desiccant pattern are formed. With this configuration, it has been achieved to manufacture a highly reliable organic EL display apparatus in more simplified process.

10 Claims, 7 Drawing Sheets

ORGANIC ELECTROLUMINESCENCE DISPLAY APPARATUS AND METHOD FOR MANUFACTURING THE SAME

BACKGROUND OF THE INVENTION

The present invention relates to a sealing structure of an organic electro-luminescence light emitting element (organic EL element) that is used for an organic electro-luminescence display apparatus (organic EL display apparatus).

In the organic EL element, there is a possibility that a so-called dark spot (non light-emitting portion) may be generated, due to invasion of moisture into the element. Given this situation, the organic EL element is generally sealed by a sealing cap made of metal or glass, which is provided with a desiccant, thereby preventing the moisture from invading the element. As a technique for sealing the organic EL element by the sealing cap provided with the desiccant, there are known techniques as disclosed in the Japanese Patent Laid-open Publication No. H9-148066 (hereinafter, referred to as "patent document 1"), and in Japanese Patent Laid-open Publication No. 10-275679 (hereinafter, referred to as "patent document 2").

According to the technique as disclosed in the patent document 1, the organic EL element is sealed by a sealing cap on the bottom of which there is fixed a desiccant to absorb moisture chemically, and the desiccant maintains its solid state even after absorbing the moisture. According to the technique as disclosed in the patent document 2, the organic EL element is sealed by a sealing cap having an absorbent porous layer, such as $SiO_2$ and zeolite, formed on the internal surface.

In the meantime, for the purpose of reducing manufacturing cost and the like, there is known a technique as disclosed in the Japanese Patent Laid-open Publication No. 2002-280169 (hereinafter, referred to as "patent document 3") in which the organic EL element is sealed without using the metal cap. According to this art as disclosed in the patent document 3, the organic EL element is sealed with a sealing board such that on one surface of the sealing board, double frame-like patterns (internal partition and external partition) are formed along the edge of the sealing board, by applying and burning a low-melting-point glass frit. Furthermore, a sealant is disposed between the internal partition and the external partition, and a moisture absorbent is applied on the region surrounded by the internal partition. Subsequently, the element substrate and the sealing board are bonded together, so that the organic EL element on the element substrate is placed inside the internal partition.

SUMMARY OF THE INVENTION

According to the aforementioned conventional technique for sealing the organic EL element with the sealing board, a low-melting-point glass frit paste is printed on the sealing board, which is then fired to form the internal partition and the external partition, and its is further necessary to print the moisture absorbent in the region inside the internal partition.

The present invention helps to manufacture a highly reliable organic EL display apparatus in a more simplified process.

The present invention is directed to a method of manufacturing an organic electro-luminescence display apparatus provided with a first board on a first plane of which an organic electro-luminescence element is—formed, a second board having a second plane being opposed to the first plane, and a sealant provided between the first plane and the second plane, including, A step which performs printing with a desiccant paste, by use of a screen mask having a first opening pattern in a form of a frame, a second opening pattern surrounding the first opening pattern, and a third opening pattern surrounded by the first opening pattern, the third pattern having an opening width narrower than the first opening pattern, so as to form on the second plane a first desiccant pattern in a form of the frame, as second desiccant pattern surrounding the first desiccant pattern, and a third desiccant pattern having a thinner film thickness than the first desiccant pattern, inside the first desiccant pattern, and, a step which supplies a sealant between the first desiccant pattern and the second desiccant pattern, and bonds the first plane and the second plane together so that the third desiccant pattern and the organic electro-luminescence element are opposed to each other.

According to the present invention, it is possible to manufacture a highly reliable organic EL display apparatus in a more simplified manufacturing process.

BRIEF DESCRIPTION OF THE DRAWING

These and other features, objects and advantages of the present invention will become more apparent from the following description when taken in conjunction with the accompanying drawings wherein.

DETAILED DESCRIPTION OF PREFERRED EMBODIMENTS

Hereinafter, an embodiment of the present invention will be explained with reference to the accompanying drawings.

Firstly, a configuration of the organic EL display apparatus according to the present embodiment will be explained. Here, a television set is taken as an example of the organic EL display apparatus.

Figure 8:
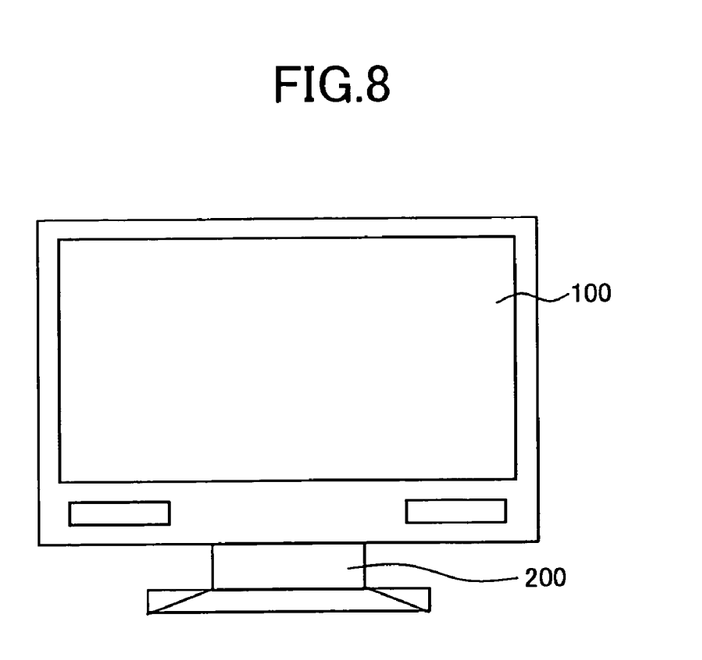
FIG. 8 is an outer view of electronic equipment (monitor) according to an embodiment of the present invention.

As shown in FIG. 8, the television set according to the present embodiment includes a passive or active type organic EL panel 100, an enclosure 200 accommodating the organic EL panel 100 and other equipment, and the like.

Figure 1:
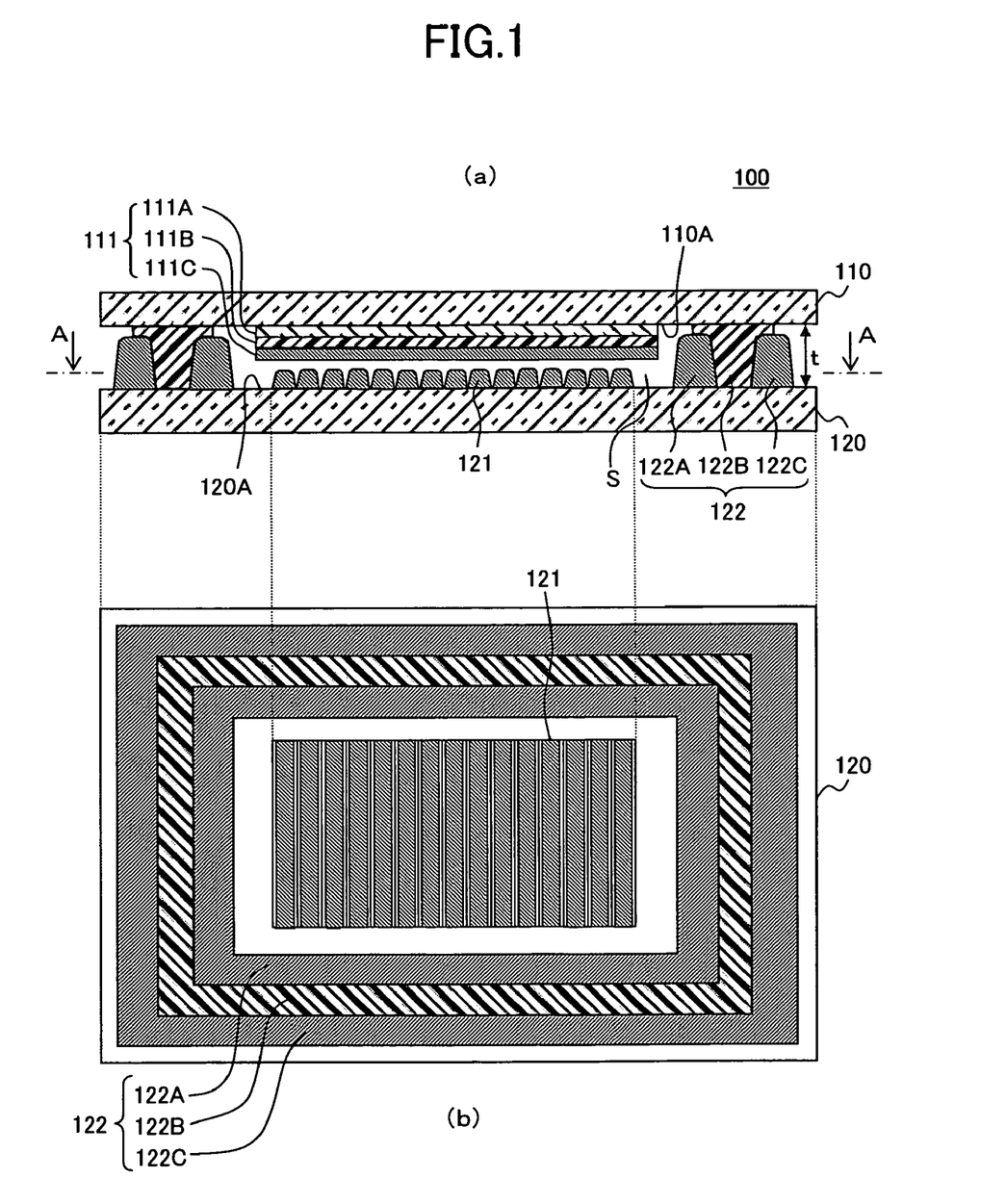
FIG. 1 shows a cross sectional view (a) to explain an organic EL panel according to an embodiment of the present invention, and a cross sectional view (b) of the cross section view (a) taken along line A-A.

As shown in FIG. 1A and FIG. 1B, the organic EL panel 100 includes constituent elements such as (1) a pair of boards opposed to each other (element substrate 110, sealing board 120), and (2) a board connecting part 122 which is provided in a form of a frame, along the edge of the sealing board 120, interposed between the sealing board 120 and the element substrate 110 so that space S is formed between the sealing board 120 and the element substrate 110. Details of each of these boards 110, 120 and the board connecting part 122 will be described in the following.

A. Element Substrate 110

On one surface 110A of the element substrate 110 facing the sealing board 120 (hereinafter, referred to as the "element formation surface"), there are formed an organic EL element 111 accommodated in space S and an extraction electrode (not illustrated) into which a driving signal of the organic EL element 111 is inputted.

The organic EL element 111 includes, in the order viewed from the element substrate 110 side, a cathode 111A made of a transparent conductor such as ITO (Indium Tin Oxide) and IZO (Indium Zinc Oxide), an organic film 111B containing an emitting layer, and anode 111C made of an appropriate metal such as Mg—Ag, Al—Li, Al—Lif, and Al—Ca.

An organic compound used as a formation material for the organic film 111B is generally classified into a low-molecular-weight substance group and a polymeric substance group. The low-molecular-weight organic film generally has a four-layer structure including a hole-injection layer, a hole-transport layer, an emitting layer, and an electron-transport layer, in the order viewed from the cathode 111A side. Each of these layers is formed by an evaporation method, sputtering, or the like.

It is to be noted here that the low-molecular-weight organic film does not always have this four-layer structure, since one layer may be provided with multiple features depending on what type of material is used. For example, if the emitting layer is made of a material that is additionally provided with a property for electron transporting, the electron-transport layer is omitted.

On the other hand, the polymeric organic film generally has a two-layer structure including a hole-transport layer also serving as a hole-injection layer and an emitting layer. Each of these layers is formed by an ink-jet method, a printing method, or the like. The polymeric organic film may also be different in layer structure, depending on a material used for forming the film.

The organic material used to form each of the organic fill layers in the present embodiment is not particularly limited, as long as the material performs functions expected of each layer. For instance, it is possible to use general materials such as poly-phenylenevinylene, poly-fluorene, poly-srio and poly-phebtkebe.

B. Sealing Board 120

On one surface 120A facing to the organic EL element 111 (hereinafter, referred to as the "desiccant pattern formation surface") of the sealing board 120, there are formed multiple lines of a band-like desiccant pattern (hereinafter, referred to as the "internal desiccant pattern") 121 that are accommodated in the space S together with the organic EL element 111. Since multiple lines of the band-like desiccant pattern 121 are formed as thus described, the total surface area of the internal desiccant pattern 121 is increased compared to the case where only one desiccant pattern larger in size is formed. Therefore, it is possible to efficiently remove moisture within the space S.

Here, it is desirable that a moisture absorbent contained in the internal desiccant pattern 121 has a property such as releasing little absorbed moisture or not releasing any moisture, even under high temperature of 100° C. or higher. Furthermore, in order to prevent excessive thermal stress to the board connecting part 122, it is desirable that the sealing board 120 is made of a material having a coefficient of linear expansion different from that of the element substrate 110 forming material within a predetermined range, and further, it is also desirable that the sealing board 120 is formed with a board thickness approximately equal to that of the element substrate 110.

C. Board Connecting Part 122

The board connecting part 122 has a three-layer structure, including a frame-like desiccant pattern 122A (hereinafter, referred to as the "inside surrounding desiccant pattern") surrounding the organic EL element 111 and the internal desiccant pattern 121, a frame-like desiccant pattern 122C (hereinafter, referred to as "outside surrounding desiccant pattern") surrounding the inside surrounding desiccant pattern 122A, and a sealant 122B filled between the inside and outside surrounding desiccant patterns 122A and 122C.

The inside and outside surround desiccant patterns 122A, 122C function as partitioning walls to prevent flowing of sealant 122B that is not yet cured while pressure is applied, and also prevent moisture from seeping into the space S, the moisture passing through the sealant 112B having been cured. It is desirable that the inside and outside surround desiccant patterns 122A, 122C interposing the sealant therebetweeen are formed thicker than the internal desiccant patterns 121, so as to allow the sealant to be thick enough to prevent the organic EL element 111 from coming into contact with the internal desiccant pattern 121.

As thus described, the firm thicknesses of the inside and the outside surrounding desiccant patterns 122A, 122C are each different from that of the internal desiccant pattern 121. However, those three kinds of desiccant patterns 121, 122A and 122C are formed on the sealing board 120 by a one-time screen printing by use of one piece of screen mask, which will be described below. Thereby, the inside and outside surrounding desiccant patterns 122A, 122C are thicker in line width and larger in film thickness.

The sealant 122B includes sphere shaped beads, column-shaped fibers or the like, each having a diameter larger than the sum of the film thickness of the internal desiccant pattern 121 and the film thickness of the organic EL element 111, as spacers (not illustrated). Since the distance t between the element substrate 110 and the sealing board 120 is controlled by the spacers, it is possible to prevent the internal desiccant pattern 121 from coming into contact with the organic EL element 111. It is preferable that a material of the spacer is a chemically stable inorganic material, such as SiC, SiN, $SiO_2$, and $Al_2O_3$.

If the film thickness of the inside surrounding desiccant pattern 122A is much smaller than the diameter of the spacer, it may become more difficult to remove moisture passing through the sealant 122B. Furthermore, the not-yet-cured sealant 122B may protrude into the space S side, going over the inside surround desiccant pattern 122A. If the film thickness of the outside surrounding desiccant pattern 122C is much smaller than the diameter of the spacer, the not-yet-cured sealant 122B may protrude outside, going over the outside surrounding desiccant pattern 122C.

In order to prevent the above situation from occurring, it is desirable that the film thickness sizes of the inside and outside surrounding desiccant patterns 122A, 122C are respectively, at least 50% of the diameter of the spacer and not more than the diameter of the spacer. It is to be noted that if multiple organic EL panels are taken from one piece of transparent substrate, the film thickness of the outside surrounding desiccant pattern 122C may be allowed to be less than 50% of the size of the spacer, as long as there is provided enough clearance between the organic EL panels, so that the sealant protruding outside may not have influence on cutting out of individual organic EL panels.

Next, explanations will be given regarding the screen mask which is used for screen printing to form the desiccant patterns 121, 122A, and 122C.

On the screen mask, there are formed three kinds of openings respectively to form the internal desiccant pattern, and the inside and outside surrounding desiccant patterns each having a film thickness different from the internal desiccant pattern. In other words, the openings are respectively for forming the internal desiccant pattern 121, the inside surrounding desiccant pattern 122A, and the outside surrounding desiccant pattern 122C.

Figure 2A:
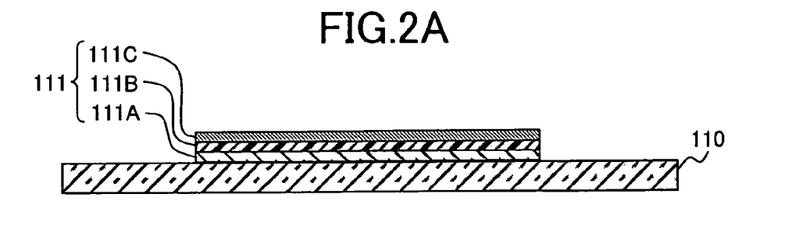
FIGS. 2A, 2B, 2C and 2D are illustrations to explain steps of manufacturing the organic EL panel for a passive-type organic EL display apparatus according to an embodiment of the present invention.
Figure 2B:
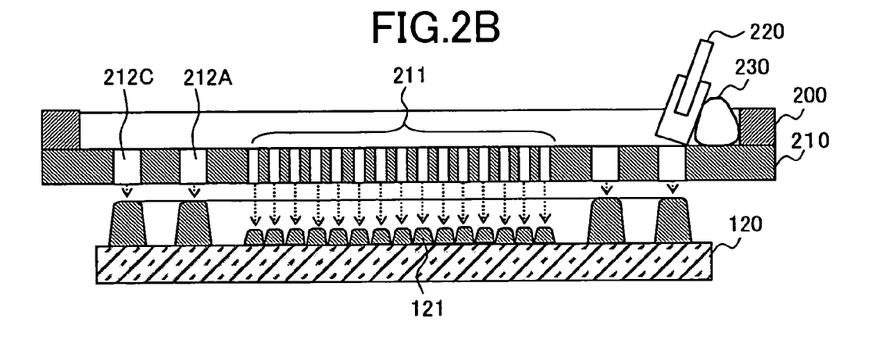

The width of the openings prepared for the internal desiccant pattern out of those three kinds of openings, is set narrower than the width of the other two openings 122A and 122C (see FIG. 2B). With such a configuration above, it is possible to make the film thickness of the internal desiccant pattern 121 thinner than those of the inside and outside surrounding desiccant patterns 122A and 122C. In other words, by use of the screen mask on which openings with different width dimensions are formed, it is possible to form the desiccant patterns 121, 122A, and 122C, each different in film thickness, by screen printing only once.

It is to be noted here that the film thickness of the coating film which is formed by the screen printing may be influenced not only by the opening width dimension of the screen mask but also by other specifications of the screen mask. Therefore, it is necessary to check such influences in advance by experimental testing. For example, the opening which is formed by 300-meshes having a wire diameter of around 20 μm with an emulsion layer having a film thickness of around 20 μm may generate a thicker coating film as the opening becomes wider. However, if the opening width is more than approximately 150 μm, a coating film having a substantially uniform film thickness may be generated. Therefore, if a screen mask having such a specification as described above is employed, it is necessary to set the widths of the openings less than 150 μm for forming the lines of the internal desiccant pattern, which are required to be formed thinner than the inside and outside surrounding desiccant patterns 122A and 122C.

Next, a desiccant paste will be explained, which is used in the screen printing to form the desiccant patterns 122, 122A and 122C.

In order to preferably form the internal desiccant pattern, and the inside and outside surrounding desiccant patterns each having a film thickness different from the internal desiccant pattern, it is necessary to control the desiccant paste as well as the specification of the screen mask.

The desiccant paste is produced by processing into past form, a powder or bulk of moisture absorbent having a moisture absorbing capability (for example, alkali metal oxide (calcium oxide and strontium oxide, etc.), alkaline earth metals oxide, and poromeric inorganic material (zeolite, etc.)), by use of an organic or inorganic binder and an organic solvent or the like. Accordingly, the viscosity of the thus-produced desiccant paste is different depending on the content by percentage with respect to each of those materials.

The paste used for the screen printing has a viscosity of around 15 Pa·s (Pascal seconds) to around 1,000 Pa·s. In the present embodiment, since it is necessary to maintain the difference in the film thickness among the desiccant patterns 121, 122A and 122C, the screen printing has actually been performed by use of a desiccant paste having the viscosity of 15 Pa·s to 1,000 Pa·s, so as to confirm such difference.

Consequently, if the viscosity of the desiccant paste is less than 200 Pa·s, the desiccant pattern spreads out and is likely to become thin. Therefore, it has been found that the viscosity above makes it difficult to maintain the film thickness difference among the inside and outside surrounding desiccant patterns and the internal desiccant pattern. On the other hand, if the viscosity of the desiccant paste goes beyond 800 Pa·s, the moisture absorbent is not dispersed and is likely to remain in a form of a large aggregate. Therefore, it has been found that the viscosity above makes it difficult to form the inside and outside surrounding desiccant patterns and the internal desiccant pattern with high form accuracy.

Furthermore, it has been found that if the viscosity of the desiccant paste is at least 200 Pa·s and not more than 800 Pa·s, it is possible to form the desiccant patterns 121, 122A and 122c with accuracy, and the film thickness difference among the desiccant patterns 122, 122A and 122C are maintained as well.

According to the results as described above, a desiccant paste having the viscosity of from 200 Pa·s to 800 Pa·s is utilized in the present embodiment. It is to be noted here that the viscosity of the desiccant paste as described above is a value measured by the RE-550 Viscometer (Toki Sangyo Co., Ltd.) at the shear rate 2.0 s$^{-1}$, employing a cone-shaped rotor radium R 9.7 at the angle 3.7.

In addition, it has been found that if the weight ratio of the binder for the desiccant paste is less than 0.5%, it is hard for the desiccant pattern to maintain the film shape after removing the organic solvent. On the other hand, it has been also found that if the weight ratio of the binder for the desiccant paste is larger than 5%, then the surface of the moisture absorbent is coated by the excessive binder, thereby deteriorating the moisture absorbing power of the material. Therefore, in the present embodiment, the binder is set to be approximately 0.5 to 5 wt. % of the desiccant paste.

When the desiccant paste satisfying the above conditions is prepared, by use of synthetic zeolite as the moisture absorbent for example, such preparation is performed with an organic solvent of approximately 25 to 40 wt % of the desiccant paste, and with the binder of approximately 0.5 to 5 wt % of the desiccant paste.

In order that the moisture absorbent passes through the opening pattern smoothly, it is preferable that the particle diameter of the moisture absorbent is equal to or less than one-fifth of the opening pattern width. For example, if the line width of the opening pattern is approximately 150 μm, the maximum particle diameter of the moisture absorbent is required to be equal to or less than 30 μm, which is one-fifth of the line width of the opening pattern.

Under the current circumstances, when a powder having a maximum particle diameter equal to or less than 30 μm is produced, classifiers such as sieve classification using meshes, water-ratio classification utilizing a gravity of particle compared with water velocity, and a centrifugal method are employed. However, if these classifiers are used, a distribution occurs in the particle size. Therefore, a powder having an average particle diameter of approximately 4 μm may be produced in the case where the maximum particle diameter of the powder is approximately 30 μm.

In the present embodiment, as described above, since the opening width for forming the internal desiccant pattern is required to be 150 μm or less, it is necessary that the average particle diameter and the maximum particle diameter of the moisture absorbent are respectively 4 μm or less and 30 μm or less. In the current circumstances, however, the minimum width of the opening required for a stable formation on the screen mask is approximately 20 μm. Therefore, the maximum particle diameter of the moisture absorbent is set to be approximately 4 μm or less, which is one-fifth of 20 μm.

If there is a situation where forming an opening pattern having a much narrower width is possible, the maximum particle diameter of the moisture absorbent is required to be further smaller.

In order to suppress the sedimentation of the moisture absorbent within the desiccant paste, it is preferable that the particle diameter of the moisture absorbent is small. Therefore, in general, there is no particular restriction with regard to the minimum particle diameter of the moisture absorbent. However, if there is a problem in the function as a desiccant, in the screen printing process, or in storing and the like, there may be a restriction on the minimum particle diameter of the moisture absorbent. This situation will be explained with taking zeolite as an example.

As a type of zeolite, synthetic zeolite has a specific surface area larger than that of artificial zeolite or natural zeolite, and thus it is capable of controlling the particle diameter in synthesizing. The synthetic zeolite, which is aluminum-silicate having a three-dimensional skeleton texture, is expressed in a regular formula $aM_{2/n} \cdot xAl_2O_3 \cdot ySiO_2 \cdot zH_2O$ (M: positive ion, a: integer representing the number of metal oxide molecules, x: integer representing the number of aluminum oxide molecules, y: integer representing the number of silicon oxide molecules, z: integer representing the number of crystal water molecules), and the synthetic zeolite is classified into A-type zeolite, X-type zeolite, Y-type zeolite and the like, according to the type of positive ion M and the ratio between x being aluminum oxide counts and y being silicon oxide counts. Since those zeolite materials are different in hole-diameter, targets for absorption are also different.

Since a moisture absorbent having a high moisture-absorption capability is suitable for the desiccant paste in the present embodiment, A-type zeolite is appropriate, in which the ratio between $Al_2O_3$ and $SiO_2$ (x:y) is 1:2.

As specific examples of positive ion M, there are alkali metals (sodium ion, potassium ion), alkaline-earth metals (calcium ion, magnesium ion), ammonium ion and the like. In the case being considered here, the A3-type zeolite ($K_2O \cdot Al_2O_3 \cdot 2SiO_2(\cdot zH_2O)$), in which a potassium ion is used as the positive ion M, is suitable for mainly absorbing water. The crystal wafer is contained since it is necessary for synthesizing, but there is no particular restriction as for z.

In order that the synthetic zeolite (having a hole diameter of approximately 3 Å) structurally functions as a desiccant, it is necessary that the particle diameter is around 100 times larger than the hole diameter. It is preferable that the particle diameter of the moisture absorbent is small so as to suppress the sedimentation of the moisture absorbent within the desiccant paste. From a viewpoint to exercise the function as the desiccant, the minimum particle diameter of the synthetic zeolite can be restricted to around 100 times larger than the hole diameter. It is to be noted here that in order to satisfy the restriction above, the average particle diameter of the synthetic zeolite is required to be at least 0.3 μm.

It is desirable that the organic solvent has a high boiling point and low vapor pressure at room temperature, so that a viscosity change or the like may not occur in the desiccant paste. It is further preferable that the organic solvent hardly damages the emulsion layer of the screen mask, such as dissolving or swelling the emulsion layer. By way of example, it is preferable to employ an organic solvent such as Butyl Carbitol Acetate (i.e., 2-(2-n-butoxyethoxy)ethyl acetate, α-Terpineol, and the like.

As an organic binder, it is possible to employ, for example, a cellulosic resin (ethyl cellulose, cellulose nitrate, etc.), a vinyl type resin (poly vinyl butyral, acryl resin, etc.), a thermosetting resin (epoxy resin, phenol resin, etc.), a condensation resin (a polyamide, a polyimide, etc.), and the like. In addition, as an inorganic binder, it is possible to employ, for example, a ceramic precursor, such as organosiloxane, aluminosiloxane, titan-siloxane, and borosiloxane.

Next, with reference to FIGS. 2A to 2D, a manufacturing process of the organic EL panel 100 as shown in FIGS. 1A and 1B will be explained.

An appropriate size of transparent substrate (glass substrate in this example) having an insulating property is prepared as the element substrate 110, so that the insulation state between cathodes having been subjected to patterning is maintained. In addition, a sealing board 120 is prepared, and a difference in linear expansion coefficient between the substrate serving as the sealing board 120 and that of the element substrate 110 are equal to or less than a predetermined value. In this example, a glass substrate (manufactured by Corning Inc. #1737) which is around 50 mm wide×around 50 mm long×around 0.7 mm thick is used as the element substrate 110, and a glass substrate (manufactured by Corning Inc. #1737) which is around 40 mm wide×around 40 mm long×around 0.7 mm thick is used as the sealing board 120.

The organic EL element 111 as shown in FIG. 2A is formed on the element formation surface 110A of the element substrate 110 according to the following procedure.

A transparent conductor film (for example, ITO film, IZO film, and the like), which serves as cathode 111A, is formed all over the element formation surface 110A of the element substrate 110, by sputtering method and the like. Here, since organic films are laminated on the cathodes 111A, it is preferable that there is little dispersion in film thickness of the transparent conductor film formed at this stage.

Subsequently, by a photolithograph process (resist coating, exposure, and development), a resist pattern of a predetermined shape is formed on the transparent conductive film. For example, seven resist patterns of around 2 mm wide×around 48 mm long×around 120 mm of film thickness are formed in a shape of stripes with a pitch of around 4 mm. This resist pattern is used as a mask to etch the transparent conductor film.

Accordingly, the transparent conductor film is subjected to patterning, so that the cathode 111A is formed on the element formation surface 110A of the element substrate 110.

Then, an organic film 111B is laminated on the cathode 111A thus formed. For example, if a low-molecular-weight organic film 111B is formed, a hole-injection layer of film thickness 20 nm, a hole-transport layer of film thickness 60 nm, and an emitting layer of film thickness 60 nm also provided with an electron transporting property, are sequentially formed by an evaporation method, a sputtering method or the like.

Here, copper phthalocyanine (CuPc) and the like can be used for the hole-injection layer, triphenyldiamine (TPD), bis[N-(1-naphthyl)-N-phenyl]benzidine($\alpha$-NPD), and the like, can be used for the hole-transport layer, and tris(8-quinolinolato)aluminum complex (Alq3), bis (benzo quinolinolato) beryllium complex (BeBq) and the like, can be used for the emitting layer.

On the other hand, when a polymeric organic film 111B is formed, a hole-transport layer of around 50 nm film thickness and an emitting layer of around 70 nm film thickness are sequentially formed by an ink-jet method, a printing method or the like.

Here, polyethylene dioxy-thiophene (PEDOT) and the like, can be used for the hole-transport layer, and polyparaphenylenevinylene derivative (PPV), polyfluorenes derivative (PDAF), carbazone derivative (PVK) and the like, can be used for the emitting layer.

In this example, the organic film 111A is formed by either a low-molecular-weight organic compound or a polymeric organic compound, but it is also possible to form the organic film 111A by combining both of the low-molecular-weight organic compound and the polymeric organic compound.

In addition, a metal mask having predetermined opening patterns, that is, seven openings each around 48 mm wide× around 2 mm long formed in a shape of stripes with pitch of 4 mm, is arranged so that the opening patterns cross the organic film 111A at substantially right angles, and a metal film of film thickness around 200 nm is formed as anode 111C by the evaporation method or the like. As specific examples of the anode formation material used here, there are Mg—Ag, Al—Li, Al—LiF, Al—Ca, and the like. Accordingly, the organic EL element 111 as shown in FIG. 2A is completed on the element substrate 110.

On the other hand, as shown in FIG. 2B, there are formed on the sealing board 120, internal desiccant pattern 121, inside surrounding desiccant pattern 122A and outside surrounding desiccant pattern 122C, by the screen printing using the desiccant paste that has been prepared to satisfy the above conditions (viscosity of from 200 Pa·s to 800 Pa·s and around 0.5 to 5 wt % of binder).

Specifically, the desiccant paste 230 is supplied to the screen mask 210 set up on the screen mask frame 200, and subsequently, a squeegee 220 made or urethane rubber or the like is contacted to and moved on the screen mask 210 at an angle. On the screen mask 210 used herein, there are formed linear shaped opening pattern 211 for forming the internal desiccant patterns, and frame-like opening patterns 212A and 212C for forming the inside and outside surrounding desiccant patterns, respectively, which surround the opening patterns 211.

In the present embodiment, a screen mask is used which is made by forming an emulsion layer with a film thickness of 20 μm on 325 mesh having a wire diameter of 18 μm manufactured by Murakami Corp so that there are formed 187 counts of linear opening patterns 211 of around 50 μm in line width×around 28 mm long, with pitch of around 150 μm, and opening patterns of around 200 μm in line width, like frame shape of around 35 mm wide×around 35 mm long and around 38 mm wide×around 38 mm long, respectively.

surrounding the row of linear opening patterns 211. In addition, as the desiccant paste 230, a paste having viscosity of 598 Pa·s is used, which has been generated by mixing powder (average particle diameter is 4 μm) of A3-type zeolite (around 66.4 wt %) with ethyl cellulose (around 2.5 wt %) and Butyl Carbitol Acetate (i.e., 2-(2-n-butoxyethoxy) ethyl acetate (around 31.1 wt %).

Particle size distribution of A3-type synthetic zeolite has been measured by a laser diffraction scattering method, employing a micro track particle diameter distribution measuring apparatus 9320HRA (X-100) manufactured by Nikkiso Co., Ltd., and micro track particle size distribution measuring apparatus MT3300EX manufactured by Nikkiso Co., Ltd., having been calibrated using JIS-Z8901 testing powder and testing powder 1 defined as a testing particle.

Accordingly, the desiccant paste 230 passes through each of the opening patterns 211, 212A, and 212C, and the shapes of the opening patterns 211, 212A, and 212C are respectively transferred onto the sealing board 120 with the desiccant paste 230.

Since the desiccant paste used in the present embodiment contains zeolite from which absorbed moisture is removable by heating at 100° C. or higher under a low humidity atmosphere, the screen printing may be performed in the air. However, if a desiccant paste is used which contains a moisture absorbent from which it is difficult to remove the absorbed moisture (such as calcium oxide which chemically absorbs moisture), it is preferable that the screen printing is performed in a low humidity atmosphere.

When the screen printing is completed, the organic solvent or inorganic solvent is removed from each of the desiccant patterns 121, 122A, and 122C, by a heat treatment for an appropriate period of time. When the desiccant paste containing an organic binder is used, it is necessary to adjust this heat treatment temperature to a degree at which the organic system binder for keeping the powder of the moisture absorbent in a film form may not be decomposed and removed.

In the present embodiment, since ethyl cellulose, which is an organic binder, is used, the desiccant patterns 121, 122A, and 122C are heated at approximately 100° C. for 30 minutes and further heated at approximately 180° C. for 30 minutes, so that the organic solvent is removed from the desiccant patterns 121, 122A and 122C, without decomposing and removing the ethyl cellulose.

If a desiccant paste containing an inorganic binder is used, it is preferable that the heat treatment temperature is adjusted to be enough for rendering the ceramic precursor inorganic. For example, in order that organosiloxane is rendered inorganic to obtain silica, the desiccant patterns 122, 122A and 122C are subjected to heat treatment for around 2 hours at 400° C.

As a result 187 counts of the internal desiccant patterns 121 become linear shaped pattern each having a line width of around 100 μm (average value), and a film thickness of around 12 μm (average value), and the inside and outside surrounding desiccant patterns 122A and 122C become frame-like patterns each having a line width of around 230 μm and a film thickness of around 26 μm. Subsequently, employing a hot plate, the sealing board 120 in a nitrogen atmosphere at dew point −85° C. is heated from room temperature at a warm-up speed of around 10° C. per minute, and when it becomes around 180° C., that temperature is maintained for around 10 minutes. Accordingly, moisture adsorbed by the moisture absorbent of each desiccant pattern is removed.

Figure 2C:
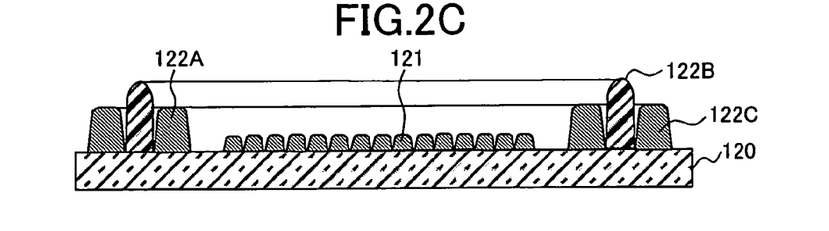

As shown in FIG. 2C, between the inside and outside surrounding desiccant patterns 122A and 122C thus formed, a sealant 122B which contains, as a spacer, around 1 wt % of beads having a larger diameter than the total film thickness of the organic EL element 111 and the internal desiccant pattern 121, for example, $SiO_2$ beads of around 30 nm, is applied by a dispenser, printing method or the like.

In this case, the application quantity of the sealant 122B is required to be adjusted according to the distance between the inside and outer surrounding desiccant patterns 122A and 122C, and the height thereof, so that the sealant 122B may not protrude towards the space S side or outside, going beyond the inside and outside surrounding desiccant patterns 122A and 122C.

It is to be noted here that as the sealant 122B, any of an ultraviolet curing material, a thermosetting material, and an ultraviolet thermosetting material may be used, but it is preferable to use a material low in moisture permeability and high in adhesive properly with the element substrate 110 and the sealing board 120. As for the thermosetting material and ultraviolet thermosetting material, it is desirable that they have a curing temperature of 100° C. or lower.

Figure 2D:
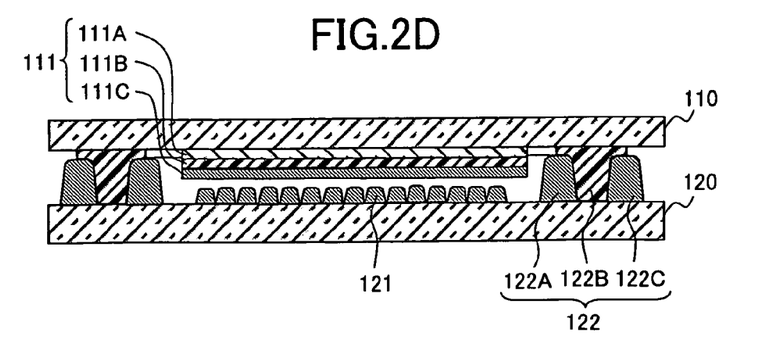

Subsequently, as shown in FIG. 2D, the element substrate 110 and the sealing board 120 are put on top of one another, in such a manner that the organic EL element 111 and the internal desiccant pattern 121 are opposed to each other. These boards 110, 120 are pressed by a precision press machine or the like, with an appropriate pressure, so that the space t therebetweeen becomes almost the same as the diameter of the spacer, and simultaneously the sealant 122B is cured. For example, when an ultraviolet thermosetting material is used as the sealant 122B, the sealant 122B is subjected to the first curing by applying ultraviolet rays X from the element substrate 110 side, and further, it is subjected to the second curing (final curing) by using a hot plate, at an appropriate temperature (for example 80° C.) for an appropriate period of time (for example, 60 minutes). At this stage, it is desirable to provide a metal plate as a mask to block the ultraviolet rays to the area where the organic EL element 111 is formed, so that the organic film 111B is not irradiated with the ultraviolet rays.

According to the procedure as described above, a passive type organic EL pane 100 is completed.

As thus described, according to the manufacturing process of the present embodiment, the inside and outside surrounding desiccant patterns 122A, 122C functioning as partitions to prevent flowing of the not-yet-cured sealant can be formed with the same material and in the same processing steps as those of the internal desiccant pattern 121. Therefore, compared to the case where the partition to prevent the flowing of the not-yet-cured sealant is made of a glass frit, the process for manufacturing the organic EL display apparatus can be simplified.

After the sealant is cured, the desiccant pattern utilized as the partition to prevent the flowing of the not-yet-cured sealant also prevents moisture from seeping into the space S inside, through the sealant, the interface between the sealant and the sealing board, and the interface between the sealant and the element substrate.

In addition, since the internal desiccant pattern absorbs the moisture which remains even after the absorption by the inside and outside surrounding desiccant patterns, seepage moisture into the organic EL element is surely prevented, thereby enhancing the reliability of the organic EL display apparatus.

In order to ensure the effect as described above, light is emitted from an organic El element of the passive type organic EL panel 100 obtained by the manufacturing process according to the present embodiment at the initial brightness 200 $cd/cm^2$, and the time is measured until the brightness is reduced by half. As a result, it has been confirmed that the time until the brightness is reduced by half is no shorter than around 4,000 hours. Consequently, it has been found that the board connecting part formed as described above fully carries out a sealing function, in cooperation with the sealing board.

In the description so far, an example of the present invention applied to the passive type organic EL panel manufacture has been explained. The manufacturing process according to the present embodiment may also be applied to the active type full color organic EL panel. Hereinafter, with reference to FIG. 5A, FIG. 5B, FIG. 6A, FIG. 6B, and FIG. 6C, a manufacturing process of the active type full color organic EL panel will be explained. It is to be noted that a manufacturing step similar to that of the passive type organic EL panel shall not be tediously explained.

A transparent substrate (for example, a glass substrate) of a suitable size and having an insulation property is prepared for the element substrate 1. In addition, a substrate for a sealing board is prepared, wherein the difference between the linear expansion coefficient of the transparent substrate and that of the substrate for the sealing board is equal to or less than a predetermined value. In this example, a glass substrate (manufactured by Corning Inc. #1737) which is around 100 mm wide×around 80 mm long×around 0.7 mm thick is used as the element substrate 110, and a glass substrate (manufactured by Corning Inc. #1737) which is made of the same material as the element substrate (around 90 mm wide×around 70 mm long×around 0.7 mm thick) is used as the sealing board 120.

Firstly, according to the following procedure, an active matrix substrate used as the element substrate 110 will be produced. Since this active matrix substrate can be manufactured according to a process similar to the process for an active matrix substrate used for an LCD, the following explanation will not include publicly known techniques, such as ion implantation and activation annealing.

Figure 5A:
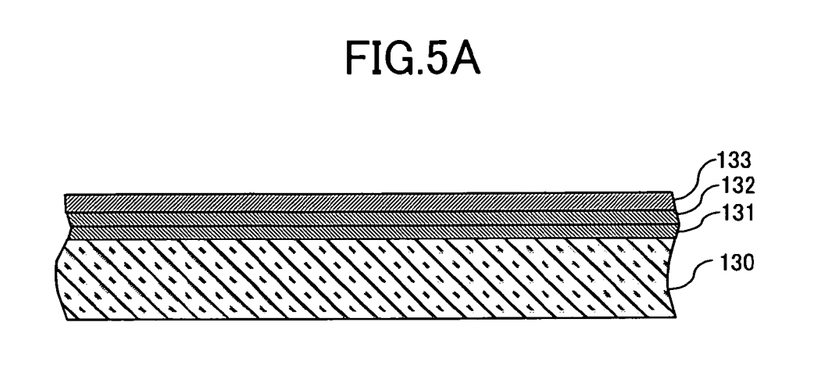
FIG. 5A and FIG. 5B are illustrations to explain steps of manufacturing the organic EL panel of the active-type organic EL display apparatus according to an embodiment of the present invention.

As shown in FIG. 5A, on one surface of the element substrate 130, a SiN film 131 and a $SiO_2$ film 132 are deposited as barrier films, by a CVD method or the like, by way of example. Further on those films, an amorphous silicon film 133 with appropriate film thickness (for example, around 50 nm) is deposited by CVD.

Figure 5B:
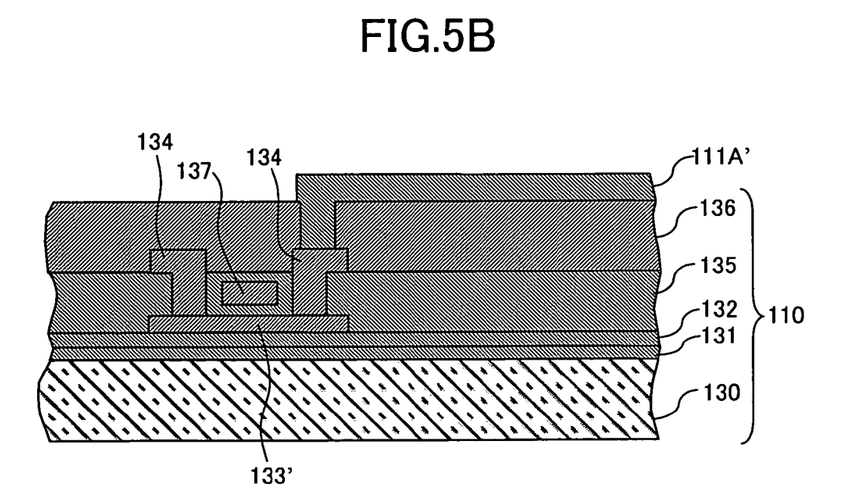

Thereafter, a region in this amorphous silicon film 133, on which a driving circuit of each pixel is to be made, is reformed by excimer laser irradiation or the like. As shown in FIG. 5B, a silicon film 133', after being reformed, is subjected to etching to a predetermined shape, and then a gate insulation film (not illustrated), a gate wiring 137, a source/drain wiring 134, an interlayer insulation film 135, and a passivation film 136 are formed thereon. Accordingly, an active matrix substrate is completed, where a predetermined number (for example, 2 to 5) of low temperature polysilicon TFT circuits are formed on each pixel part.

Subsequently, this active matrix substrate is used as the element substrate 110 and an active type organic EL panel is produced as follows.

Similar to the process for the cathode 111A of the passive type organic EL panel, cathode 111A' is formed on each low-temperature polysilicon TFT on the pixel parts by sputtering or the like. Here, it is to be noted that multiple cathodes 111A' are made in a form of a matrix in agreement with the layout of the pixel parts.

Figure 6A:
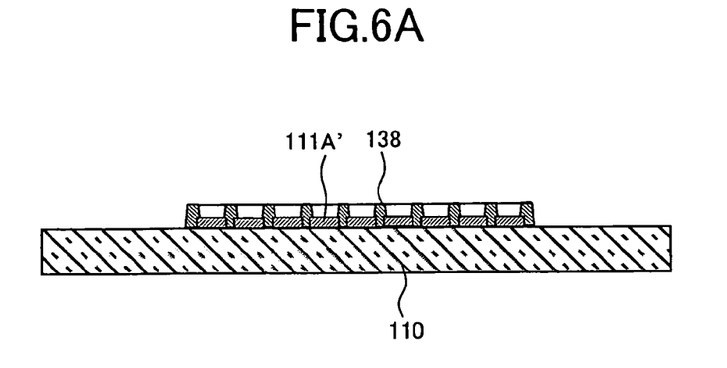
FIGS. 6A, 6B and 6C are illustrations to explain steps of manufacturing the organic EL panel for the active-type organic EL display apparatus according to another embodiment of the present invention.

Then, as shown in FIG. 6A, an insulating partition (hereinafter referred to as a "pixel separation bank") 138 is formed between the cathodes 111A', so as to separate the emitting region of each pixel part into color components (R, G, B).

For example, if a cathode 111A' of around 185 μm long×around 70 μm wide is formed in a matrix shape, 240 pieces vertically with a pitch of 255 μm and 960 pieces horizontally with a pitch of 85 μm, an insulation film having a film thickness of 0.2 μm with an opening pattern of around 165 μm long×around 55 μm wide for exposing each cathode 111A' may be formed as the pixel separation bank 138.

Here, the pixel separation bank 138 may be formed by exposing and developing a photosensitive insulation resin (polyimide, etc.) with which one surface of the element substrate is entirely coated. Alternatively, it may be formed by etching an insulation film of an organic substance formed entirely on one surface of the element substrate by sputtering or evaporation.

Figure 6B:
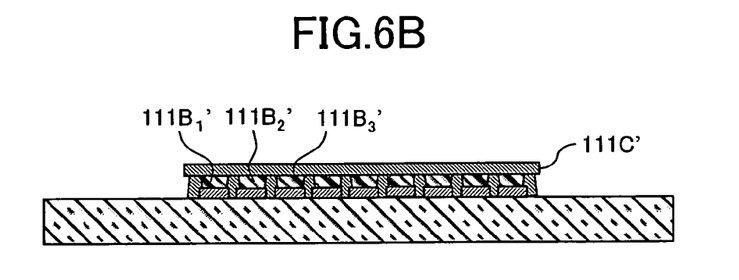

Furthermore, as shown in FIG. 6B, a red light emitting organic film 111B'$_1$, a green light emitting organic film 111B'$_2$, and a blue light emitting organic film 111B'$_3$ are formed every three regions partitioned by the pixel separation bank 138, by use of a metal mask prepared for each of the emitting color components, so that those three films are arranged in a certain order.

In order to obtain the green light emitting organic film 111B'$_2$, for example, it is possible to deposit on the cathode 111A', a CuPc film (film thickness of around 20 nm) functioning as a hole-injection layer, an α-NPD film (film thickness of around 60 nm) functioning as a hole-transport layer, and an Alq3 film (film thickness of around 60 nm) functioning as an emitting layer, in this order.

As for the red light emitting organic film 111B'$_1$, for example, around 1 wt % of dopant, such as 2, 3, 7, 8, 12, 13, 17, 18-octaethyl-21H, 23H-porphin platinum (II) (DTODP) is dispersed into a host agent such as Alq3, and it is coevaporated on the cathode 111A' to make the film thickness around 60 nm.

As for the blue light emitting organic film 111B'$_3$, around 1 wt % of dopant such as perylene is dispersed into a host agent such as Alq3, and it is coevaporated to make the film thickness around 60 nm.

Figure 6C:
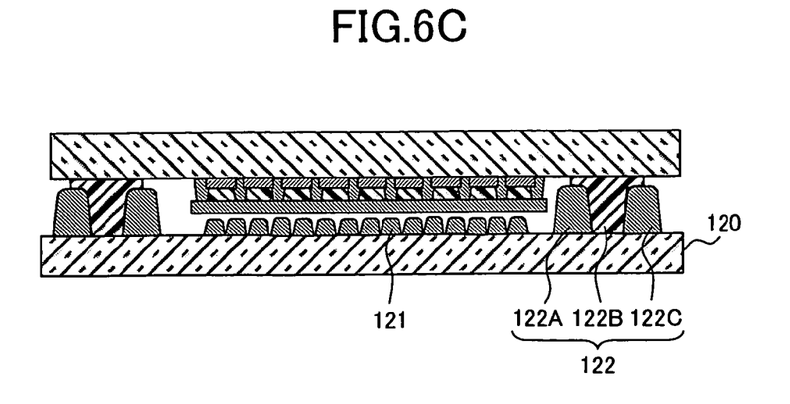

According to the procedure as described above, after the organic films 111B'$_1$ to 111B B'$_3$ (respectively) for the color components (R, G, B) are formed, as shown in FIG. 6C, anode 111C' common to each color (for example, film thickness of around 200 nm) is formed by codeposition on the organic films 111B'$_1$ to 111B B'$_3$ and the pixel separation band 138, in a similar manner as that of the anode 111C of the passive type organic EL panel. Consequently, a full color organic EL element 111' is completed on the element substrate 110.

On one surface of the sealing board 120, the internal desiccant pattern 121 and the inside and outside surrounding desiccant patterns 122A and 122C are formed within one operation, by a screen printing process similar to the process for the desiccant patterns 122, 122A and 122C of the passive type organic EL panel, each of the patterns having a size appropriate for the area of formation part on the organic EL element 111'.

For example, if a cathode 111A' of around 185 μm long×around 70 μm wide is formed in a matrix shape, 240 pieces vertically with a pitch of 255 μm, and 960 pieces horizontally with a pitch of 85 μm, 550 counts of internal desiccant patterns 121, around 100 μm wide×around 62 mm long×around 12 μm of film thickness are formed with a horizontal pitch 150 μm, and as the inside and outside surrounding desiccant patterns 122A, 122C, frame-like patterns, whose size are respectively, around 85 mm wide× around 65 mm long, and around 88 mm wide×around 68 mm long, made of linear patterns of around 230 μm wide×around 26 μm of film thickness are formed.

In addition, a sealant 122B, in which around 1 wt % of SiO$_2$ beads having a diameter of around 30 μm are mixed as a spacer, is supplied between the inside and outside surrounding desiccant patterns 122A, 122C by a dispenser, a printing method, or the like, similar to the process for manufacturing the passive type organic EL panel. Subsequently, as shown in FIG. 6C, the sealing board 120 is superposed on the element substrate 110, in such a manner that the internal desiccant pattern 121 is opposed to the organic EL element 111'. Furthermore, the sealant 122B is cured according to a process appropriate for the property of the sealant, in a similar process for manufacturing the passive type organic EL panel as described above.

Consequently, an active type organic EL panel is completed. As thus described, according to the manufacturing process of the present embodiment, for the active type organic EL panel as well, the inside and outside surrounding patterns 122A and 122C functioning as partitions for preventing flowing of the not-yet-cured sealant, can be formed within one operation using the same material as that of the internal desiccant pattern 121.

Therefore, compared to the case where the partition to prevent flowing of the not-yet-cured sealant is made of a glass frit, the process for manufacturing the active type organic EL display apparatus can be simplified.

Light is emitted from the organic EL element of the active type organic EL panel thus formed at the initial brightness 200 cd/cm$^2$ for each color component, and time is measured at nine representative points with respect to each color component until the brightness is reduced by half. As a result, it has been confirmed that the shortest time period before the brightness is reduced by half as to the blue light emitting layer is not shorter than 3,000 hours, and the shortest time period before the brightness is reduced by half as to the light emitting layers of any other color components is longer than that of the blue light emitting layer. Accordingly, it has been confirmed that moisture in the space S is efficiently removed, also in the active type organic EL panel.

In the meantime, as for the passive type and active type organic EL panels as described above, multiple lines of the band-like internal desiccant patterns 121 are formed on the desiccant pattern formation surface 120A of the sealing board 120. However, the configuration is not necessarily limited to this.

Figure 3:
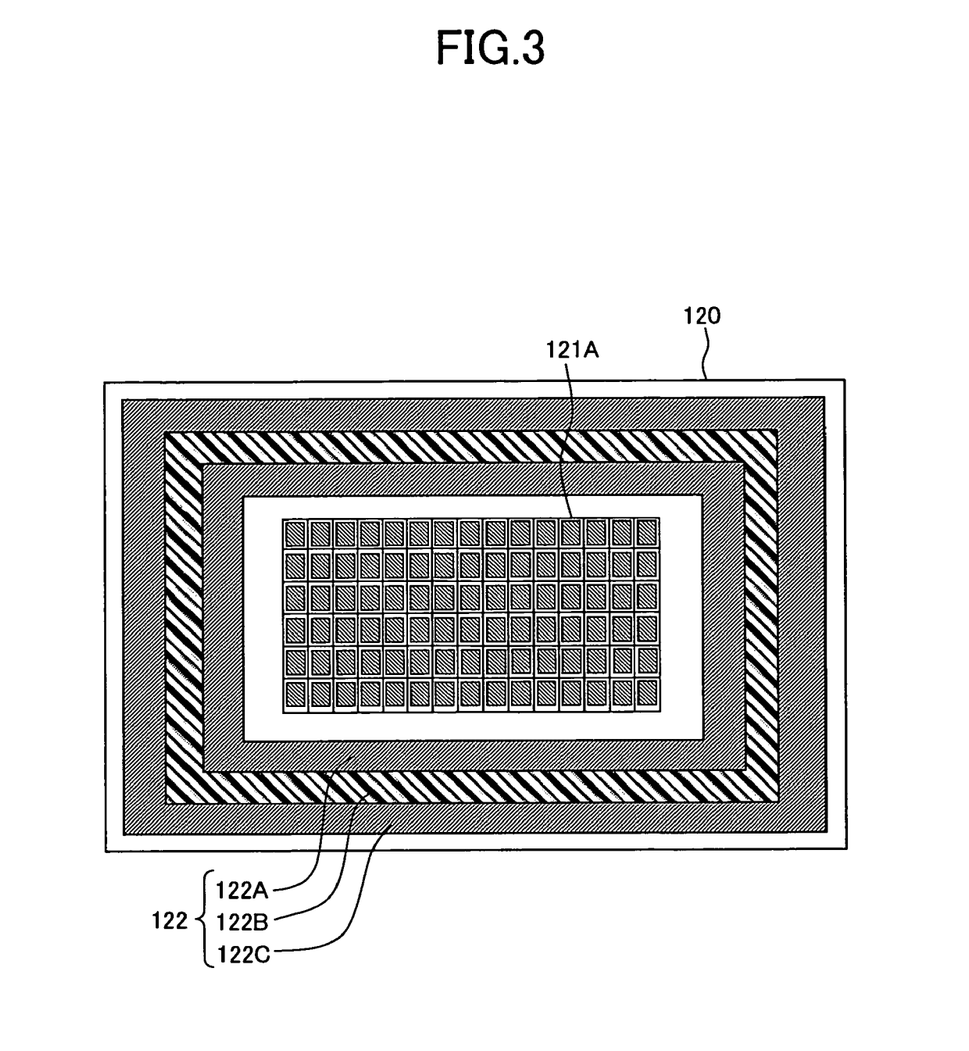
FIG. 3 shows a cross sectional view taken by a plane that passes through all the desiccant patterns of the organic EL panel according to an embodiment of the present invention.

For example, as shown in FIG. 3, it is also possible to configure such that instead of the band-like desiccant patterns 121, rectangular desiccant patterns 121A are provided in a form of a matrix, which are thinner in film thickness than the inside and outside surrounding desiccant patterns 122A, 122C, and smaller than the band-like desiccant patterns 121.

If the rectangular desiccant patterns in the matrix are arranged at appropriate intervals, they are smaller in total volume, but larger in total surface area, compared to the arrangement of band-like desiccant patterns 121 as shown in FIGS. 1A and 1B. Therefore, moisture in space S can be efficiently removed.

Here, by use of a screen mask on which rectangular opening patterns smaller than the opening patterns for forming the inside and outside surrounding desiccant patterns are provided in a form of a matrix, instead of the opening patterns 211 for the internal desiccant patterns 121, the desiccant patterns 121A can be formed in the same operation and with the same material as those of inside and outside surrounding desiccant patterns 122A and 122C.

For instance, it is possible to use a screen mask made of 325 mesh of stainless mesh wire diameter of 18 μm manufactured by Murakami Corp., being formed with rectangular opening patterns of around 60 μm wide×around 110 μm long, 187 pieces horizontally with a pitch of around 150 μm and 201 pieces vertically with a pitch of around 140 μm, instead of the opening patterns 211 for the internal desiccant pattern 121. With this screen mask, the internal desiccant pattern 121A of around 100 μm wide×around 130 μm long×around 12 μm of film thickness with a horizontal space 50 μm and vertical space 10 μm can be formed. Here, it is desirable to conduct a previous experimental testing for clarifying a relation between the size of the rectangular opening pattern and the film thickness of the coating film, and the like, since it is subjected to change according to the material of the desiccant paste and the specification of the screen mask.

The lines of desiccant patterns 121A as described above correspond to patterns into which the internal desiccant patterns 121 as shown in FIG. 1A and 1B are divided by a horizontal groove of 10 μm wide, every 140 μm approximately. The total volume of the desiccant patterns 121A is around 93% of the lines of the internal desiccant patterns 121 of FIGS. 1A and 1B, but the total surface area is around 7% larger than that of the internal desiccant pattern lines of FIGS. 1A and 1B. Therefore, as already described above, it is possible to efficiently remove moisture in space S.

In order to confirm such effects as described above, light is emitted from an organic EL element of the organic EL panel on which the rectangular internal desiccant patterns 121A are formed at the initial brightness 200 cd/cm$^2$, and the time is measured until the brightness is reduced by half. As a result, it has been found that the time until the brightness was reduced by half was not shorter than around 4,100 hours, which was longer than the organic EL panel on which the internal desiccant patterns 121 as shown in FIGS. 1A and 1B was formed. Consequently, it has been confirmed that the moisture in space S was removed efficiently.

Figure 4A:
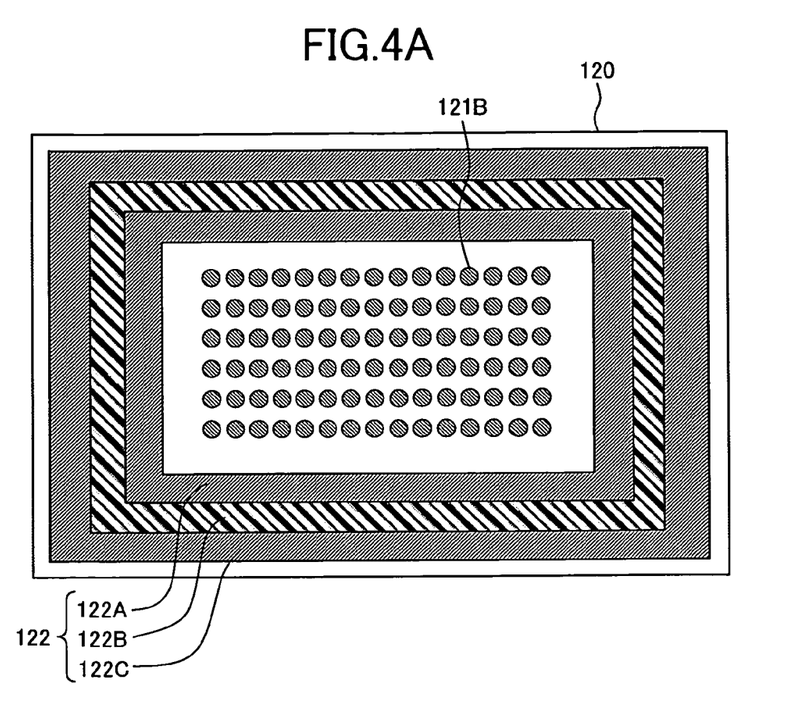
FIG. 4A shows a cross sectional view taken by a plane that passes through all the desiccant patterns of the organic EL panel according to another embodiment of the present invention.

Furthermore, instead of the band-like desiccant patterns 121, dot-like desiccant patterns 121B may be provided in a form of a matrix, as shown in FIG. 4A, which are thinner in film thickness than the inside and outside surrounding desiccant patterns 122A, 122C, and smaller than the band-like desiccant patterns 121. If such dot-like desiccant patterns 121B in the matrix are arranged at appropriate intervals, it is also possible to remove moisture more efficiently than the band-like internal desiccant patterns 121 in FIGS. 1A and 1B, with the same reasons as explained for the case of the internal desiccant patterns 121A in FIG. 3.

In order to confirm such effects as described above, light is emitted from an organic EL element of the organic EL panel on which 255×187 pieces of the internal desiccant pattern 121B having a diameter of around 100 μm×film thickness of around 12 μm are formed at the initial brightness 200 cd/cm$^2$, and the time is measured until the brightness is reduced by half. As a result, it has been found that the time until the brightness was reduced by half was no shorter than around 4,200 hours. Consequently, it has been confirmed that the moisture in space S was removed more efficiently by increasing the arrangement density of the dot-like internal desiccant patterns.

Also in this example, by use of a screen mask on which circular opening patterns having smaller diameters than the width of the opening patterns for forming the inside and outside surround desiccant patterns are provided in a form of a matrix, instead of the opening patterns 211 for the internal desiccant pattern 121, the dot-like desiccant pattern 121B can be formed in the same operation and with the same material as those of inside and outside surrounding desiccant patterns 122A and 122C. However, if the circular opening patterns are too small, it becomes harder for the desiccant paste to pass through the opening. Therefore, it is desirable that the diameter of each circular opening pattern is set to be at least 20 μm.

For instance, it is possible to use a screen mask made of 325 mesh of stainless mesh wire diameter of 18 μm manufactured by Murakaml Corp., being formed with circular opening patterns each having a diameter of around 80 μm, 187 pieces horizontally with a pitch of around 150 μm and 255 pieces vertically with a pitch of around 110 μm, instead of the opening patterns 211 for the internal desiccant pattern 121. With this screen mask, it is possible to form lines of the dot-like internal desiccant patterns 121B with the diameter of around 100 μm×around 12 μm of film thickness, together with the inside and outside surrounding desiccant patterns 122A and 122C.

It is to be noted here that it is desirable to conduct a previous experimental testing for clarifying a relation between the size of the circular opening pattern and the film thickness of the coating film, and the like, since it is subjected to change according to the material of the desiccant paste and the specification of the screen mask.

Figure 4B:
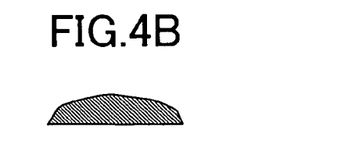
FIG. 4B shows a cross sectional view of a circular internal desiccant pattern taken by a plane perpendicular to the board.
Figure 4C:
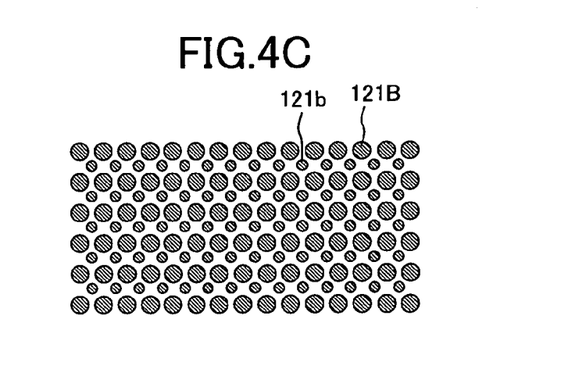
FIG. 4C is a layout example of the circular internal desiccant patterns.

In addition, if the diameter of each circular opening pattern of the screen mask is made as large as possible considering the formation film thickness, it is possible to make the dot-like internal desiccant pattern a dome-shape having a larger surface area, as shown in FIG. 4B. Further as shown in FIG. 4C, if other dot-like internal desiccant patterns 121b are added between those dot-like internal desiccant patterns 121B, each of the desiccant patterns 121b having a diameter smaller than the desiccant pattern 121B, the arrangement density of the dot-like desiccant pattern can be increased, thereby removing moisture in space S more effectively.

In order to make the total surface area of the internal desiccant patterns 121b, 121B as large as possible, it is desirable that the internal desiccant pattern 121b does not come into contact with the internal desiccant pattern 121B. Therefore, if the pitch (distance between centers) of the dot-like internal desiccant patterns 121B with the diameter of around 100 μm is around 150 μm horizontally and around 110 μm vertically, it is desirable to set the diameter of the dot-like internal desiccant patterns 121b to be around 80 μm or less.

The minimum width of the opening pattern to be formed stably on the screen mask is around 20 μm as described above, and a dot-like pattern formed by the circular opening pattern with the diameter of around 20 μm may be around 30 μm depending on the expanse of the pattern, and thus, the diameter of the dot-like internal desiccant pattern 121b may be 30 μm or more.

In the description above, a television set has been taken as an example of the organic EL display apparatus on which the organic EL panel relating to the embodiment of the present invention is implemented. However, the organic EL panel relating to the embodiment of the present invention may be implemented on electronic equipment other than the television set.

Figure 7:
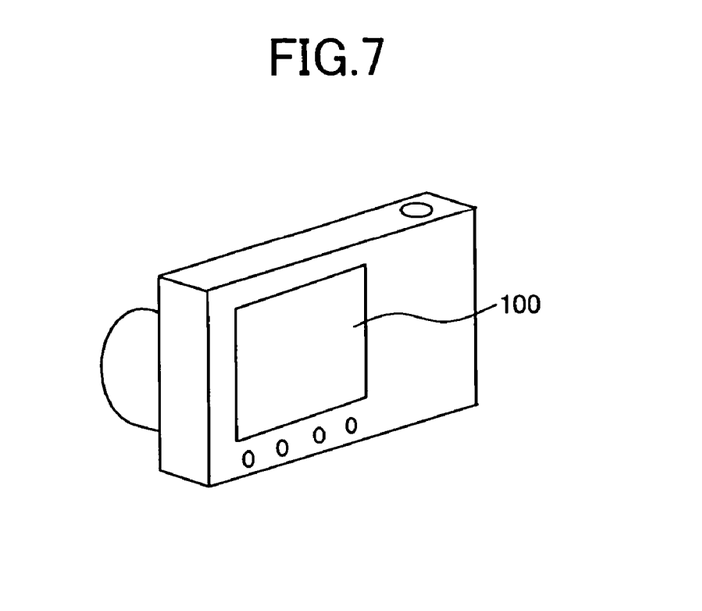
FIG. 7 is an outer view of electronic equipment (digital image taking device) according to an embodiment of the present invention.

For instance, the organic EL panel 100 relating to the embodiment of the present invention can be implemented as a monitor for checking an image captured by a digital camera, as shown in FIG. 7. The organic EL panel 100 relating to the embodiment of the present invention may also be implemented on any type of electronic equipment provided with a monitor to display an image, such as a digital video camera, a portable phone, and a personal computer.

It is to be noted that the present invention is not limited to the above configuration and it is intended that various modifications are possible without materially departing from the technical idea of this invention.

While we have shown and described several embodiments in accordance with out invention, it should be understood that disclosed embodiments are susceptible of changes and modifications without departing from the scope of the invention. Therefore, we do not intend to be bound by the details shown and described herein but intend to cover all such changes and modifications as fall within the ambit of the appended claims.

What is claimed is:

1. An organic electro-luminescence display apparatus comprising:
   a first board and a second board opposed to each other,
   an organic electro-luminescence element formed on a surface of the first board, facing to the second board,
   a first desiccant pattern which is provided between the first board and the second board, and which is formed in a shape of a frame on a surface of the second board facing the first board to surround the organic electro-luminescence element,
   a second desiccant pattern which is provided between the first board and the second board, and which is formed in a shape of another frame on the surface of the second board to surround the first desiccant pattern,
   a sealant which is interposed between the first desiccant pattern and the second desiccant pattern, to thereby seal a space between the first board and the second board that is within the frame of the first desiccant pattern from a space between the first board and the second board that is outside the frame of the second desiccant pattern, and
   a third desiccant pattern which is formed on the surface of the second board, facing to the first board, in such a manner as opposed to the organic electro-luminescence element, the third desiccant pattern having a smaller film thickness than the first desiccant pattern.

2. The organic electro-luminescence display apparatus, according to claim 1, wherein,
   the first desiccant pattern and the second desiccant pattern are made of a material which is the same as the material of the third desiccant pattern.

3. The organic electro-luminescence display apparatus, according to claim 1, wherein,
   a moisture absorbent included in the first desiccant pattern, the second desiccant pattern, and the third desiccant pattern is synthetic zeolite having an average particle diameter in the range of 0.3 µm to 4 µm, and the maximum particle diameter of 30 µm or less.

4. The organic electro-luminescence display apparatus, according to claim 1, further comprising a spacer included in the sealant.
   wherein,
   a film thickness of the first desiccant pattern is 50% or more of the diameter of the spacer and not more than the diameter of the spacer.

5. A method of manufacturing an organic electro-luminescence display apparatus including a first board on which an organic electro-luminescence element is formed in a first plane, a second board having a second plane being opposed to the first plane, and a sealant provided between the first plane and the second plane,
   the manufacturing method comprising,
   a step of performing printing with a desiccant paste by use of a screen mask on which are formed a first opening pattern in a form of a frame, a second opening pattern in a form of another frame surrounding the first opening pattern, and a third opening pattern surrounded by the first opening pattern, the third opening pattern having an opening width narrower than that of the first opening pattern, so as to form on the second plane a first desiccant pattern in the form of a frame, a second desiccant pattern in the form of another frame surrounding the first desiccant pattern, and a third desiccant pattern inside the first desiccant pattern and having a thinner film thickness than that of the first desiccant pattern, and,
   a step of supplying a sealant between the first desiccant pattern and the second desiccant pattern, and bonding the first plane and the second plane together with the sealant so that the third desiccant pattern and the organic electro-luminescence element are opposed to each other and sealed between the first plane and the second plane together with the first desiccant pattern by the sealant cured and interposed between the first desiccant pattern and the second desiccant pattern.

6. A method of manufacturing the organic electro-luminescence display apparatus according to claim 5, wherein,
   a desiccant paste of from 200 Pa·s to 800 Pa·s is used as the desiccant paste.

7. A method of manufacturing the organic electro-luminescence display apparatus according to claim 5, wherein,
   a spacer is included in the sealant, and
   a film thickness of the first desiccant pattern is 50% or more of the diameter of the spacer and not more than the diameter of the spacer.

8. A method of manufacturing the organic electro-luminescence display apparatus according to claim 5, wherein,
   the desiccant paste contains a moisture absorbent having a particle diameter which is not larger than one-fifth of an opening width of the third opening pattern.

9. A method of manufacturing the organic electro-luminescence display apparatus according to claim 5, wherein,
   a moisture absorbent contained in the desiccant paste is synthetic zeolite having an average particle diameter in the range of 0.3 µm to 4 µm and the maximum particle diameter of 30 µm or less.

10. A method of manufacturing the organic electro-luminescence display apparatus according to claim 5, wherein,
    at least one selected from cellulose system resin, vinyl system resin, a thermosetting resin, a condensation resin, organosilixane, aluminosiloxane, titan-siloxane, and borosiloxane, is used as a binder for the first desiccant pattern, the second desiccant pattern and the third desiccant pattern.

* * * * *